(12) United States Patent
Eastman et al.

(10) Patent No.: US 11,428,444 B2
(45) Date of Patent: Aug. 30, 2022

(54) ELECTROCALORIC HEAT TRANSFER SYSTEM

(71) Applicant: United Technologies Corporation, Farmington, CT (US)

(72) Inventors: Scott Alan Eastman, Glastonbury, CT (US); Joseph V. Mantese, Ellington, CT (US); Wei Xie, East Hartford, CT (US); Subramanyaravi Annapragada, South Windsor, CT (US); Parmesh Verma, South Windsor, CT (US); Sergei F. Burlatsky, West Hartford, CT (US); Wayde R. Schmidt, Pomfret Center, CT (US); Treese Hugener-Campbell, Coventry, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 520 days.

(21) Appl. No.: 16/313,762

(22) PCT Filed: Jun. 27, 2016

(86) PCT No.: PCT/US2016/039620
§ 371 (c)(1),
(2) Date: Dec. 27, 2018

(87) PCT Pub. No.: WO2018/004520
PCT Pub. Date: Jan. 4, 2018

(65) Prior Publication Data
US 2019/0170409 A1   Jun. 6, 2019

(51) Int. Cl.
*F25B 21/00* (2006.01)
*H01L 37/02* (2006.01)
*C09K 5/14* (2006.01)

(52) U.S. Cl.
CPC ............... *F25B 21/00* (2013.01); *C09K 5/14* (2013.01); *H01L 37/025* (2013.01); *F25B 2321/001* (2013.01); *Y02B 30/00* (2013.01)

(58) Field of Classification Search
CPC ...... F25B 21/00; F25B 2321/001; C09K 5/14; H01L 37/025; Y02B 30/00; Y02P 20/10
See application file for complete search history.

(56) References Cited

U.S. PATENT DOCUMENTS

| | | | | |
|---|---|---|---|---|
| RE30,856 E | * | 1/1982 | Higley et al. ......... | B29D 27/00 264/41 |
| 7,401,390 B2 | * | 7/2008 | Kumazawa ............ | B29D 7/01 26/93 |

(Continued)

OTHER PUBLICATIONS

International Search Report for International Application No. PCT/US2016/039620 dated Mar. 30, 2017, 6 pages.

(Continued)

*Primary Examiner* — Ana M Vazquez
(74) *Attorney, Agent, or Firm* — Cantor Colburn LLP

(57) ABSTRACT

A heat transfer system is disclosed in which, an electrocaloric material includes a copolymer of a monomer mixture including (i) vinylidene fluoride, (ii) an addition polymerization monomer selected from tetrafluoroethylene, trifluoroethylene, or a monomer smaller than trifluoroethylene, and (iii) a halogenated addition polymerization monomer different than (ii) that is larger than vinylidene fluoride. The electrocaloric material also includes an additive selected from a nucleating agent having a polar surface charge, electrocalorically active solid particles, or a combination thereof. Electrodes are disposed on opposite surfaces of the electrocaloric material, and an electric power source is configured to provide voltage to the electrodes. The system also includes a first thermal flow path between the electro- (Continued)

caloric material and a heat sink, and a second thermal flow path between the electrocaloric material and a heat source.

18 Claims, 1 Drawing Sheet

(56) References Cited

U.S. PATENT DOCUMENTS

| | | | | |
|---|---|---|---|---|
| 8,371,128 | B2* | 2/2013 | Kruglick | F25B 21/00 |
| | | | | 62/3.1 |
| 2011/0016885 | A1 | 1/2011 | Zhang et al. | |
| 2015/0075182 | A1* | 3/2015 | Cheng | H01L 37/025 |
| | | | | 62/3.1 |
| 2015/0353700 | A1 | 12/2015 | Isaka et al. | |
| 2016/0087185 | A1* | 3/2016 | Cheng | H01L 37/025 |
| | | | | 62/3.1 |

OTHER PUBLICATIONS

Li, Qi, et al., "Solution-processed ferroelectric terpolymer nanocomposites with high breakdown strength and energy density utilizing boron nitride nanosheets," Energy & Environmental Science 2015, 8.922; Nov. 2014; 11 pgs.

Ozbolt, M., et al., "Electrocaloric refrigeration: Thermodynamics, state of the art and future perspectives," University of Ljubljana, International Journal of Refrigeration 40 (2014); pp. 174-188.

Written Opinion of Internation Searching Authority for International Application No. PCT/US2016/039620 dated Mar. 30, 2017, 10 pages.

Zhang, Guangzu, et al., "Ferroelectric Polymer Nanocomposites for Room-Termperature Electrocaloric Refrigeration"; Adv. Mater. 2015, 27, pp. 1450-1454.

* cited by examiner

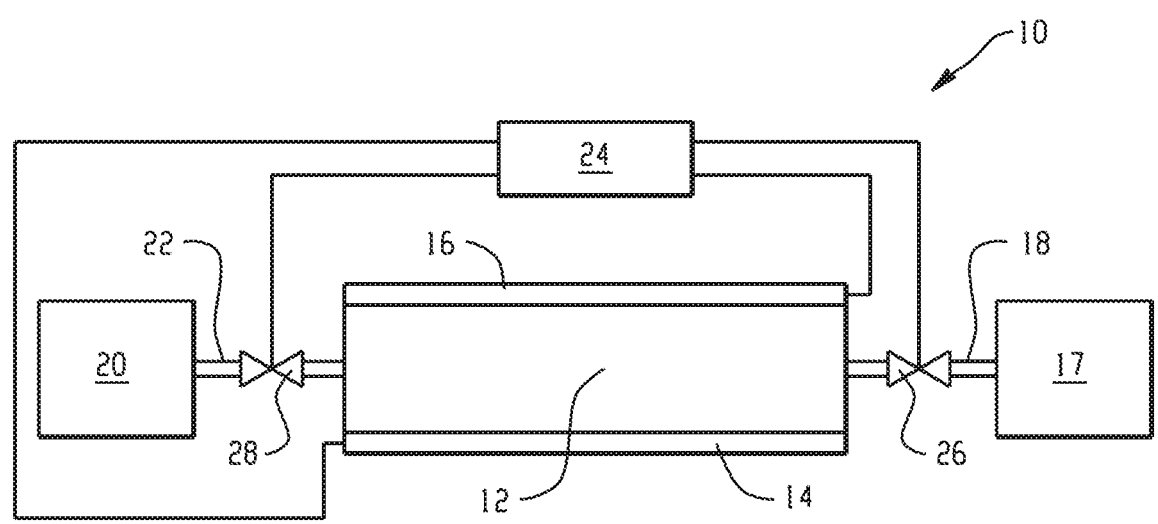

ELECTROCALORIC HEAT TRANSFER SYSTEM

CROSS-REFERENCE TO RELATED APPLICATIONS

This application claims the benefit of PCT/US2016/039620 filed Jun. 27, 2016, which is incorporated herein by reference in its entirety.

BACKGROUND

A wide variety of technologies exist for cooling applications, including but not limited to evaporative cooling, convective cooling, or solid state cooling such as electrothermic cooling. One of the most prevalent technologies in use for residential and commercial refrigeration and air conditioning is the vapor compression refrigerant heat transfer loop. These loops typically circulate a refrigerant having appropriate thermodynamic properties through a loop that comprises a compressor, a heat rejection heat exchanger (i.e., heat exchanger condenser), an expansion device and a heat absorption heat exchanger (i.e., heat exchanger evaporator). Vapor compression refrigerant loops effectively provide cooling and refrigeration in a variety of settings, and in some situations can be run in reverse as a heat pump. However, many of the refrigerants can present environmental hazards such as ozone depleting potential (ODP) or global warming potential (GWP), or can be toxic or flammable. Additionally, vapor compression refrigerant loops can be impractical or disadvantageous in environments lacking a ready source of power sufficient to drive the mechanical compressor in the refrigerant loop. For example, in an electric vehicle, the power demand of an air conditioning compressor can result in a significantly shortened vehicle battery life or driving range. Similarly, the weight and power requirements of the compressor can be problematic in various portable cooling applications.

Accordingly, there has been interest in developing cooling technologies as alternatives to vapor compression refrigerant loops.

BRIEF DESCRIPTION

In some embodiments of the disclosure, a heat transfer system comprises an electrocaloric material, which comprises a copolymer of a monomer mixture. The monomer mixture comprises (i) vinylidene fluoride, (ii) an addition polymerization monomer selected from tetrafluoroethylene, trifluoroethylene, or a monomer smaller than trifluoroethylene, and (iii) a halogenated addition polymerization monomer different than (ii) that is larger than vinylidene fluoride. The electrocaloric material also includes an additive selected from a nucleating agent having a polar surface charge, electrocalorically active solid particles, or a combination thereof. Electrodes are disposed on opposite surfaces of the electrocaloric material, and an electric power source is configured to provide voltage to the electrodes. The system also includes a first thermal flow path between the electrocaloric material and a heat sink, and a second thermal flow path between the electrocaloric material and a heat source.

In some embodiments of the disclosure, a method of making an electrocaloric element comprises forming and solidifying a film of a fluid composition comprising an electrocaloric polymer and an additive. The polymer is a copolymer of monomers comprising (i) vinylidene fluoride, (ii) an addition polymerization monomer selected from tetrafluoroethylene, trifluoroethylene, or a monomer smaller than trifluoroethylene, and (iii) a halogenated addition polymerization monomer different than (ii) and larger than vinylidene fluoride. The additive is selected from a nucleating agent having a polar surface charge, electrocalorically active solid particles, or a combination thereof. According to the method, the fluid composition is formed into a solid film comprising the electrocaloric copolymer. The film is disposed between electrodes to form the electrocaloric element.

In some embodiments of the above method, forming and solidifying the film comprises dissolving or dispersing the copolymer in a liquid composition comprising an organic solvent, casting a film of the liquid composition on a substrate, evaporating the solvent to solidify the film, and removing the film from the substrate.

In any one or combination of the above method embodiments, the additive is dissolved or dispersed in the fluid composition, or the substrate surface comprises the additive, or the additive is dissolved or dispersed in the fluid composition and the substrate surface comprises a nucleating agent.

In any one or combination of the above method embodiments, forming and solidifying the film comprises forming a thermoplastic fluid melt comprising the copolymer, forming a film of the thermoplastic fluid melt, and cooling to solidify the film.

In any one or combination of the above method embodiments, the additive is dissolved or dispersed in the thermoplastic fluid melt, or the thermoplastic fluid melt is cast onto a substrate comprising the additive, or the additive is dissolved or dispersed in the thermoplastic fluid melt and the thermoplastic fluid melt is cast onto a substrate comprising the additive.

In some embodiments, a method of making a heat transfer system comprises making an electrocaloric element according to any one or combination of the above method embodiments, and further comprising providing a heat flow path between the electrocaloric element and a heat source or a heat sink for controlled heat transfer between the electrocaloric element and the heat source or heat sink.

In any one or combination of the foregoing embodiments, the addition polymerization monomer (ii) comprises trifluoroethylene.

In any one or combination of the foregoing embodiments, the addition polymerization monomer (iii) comprises chlorofluoroethylene or a halogenated addition polymerization monomer larger than chlorofluoroethylene.

In any one or combination of the foregoing embodiments, the addition polymerization monomer (iii) comprises chlorofluoroethylene.

In any one or combination of the foregoing embodiments, the additive comprises a molecular nucleating agent.

In any one or combination of the foregoing embodiments, the additive comprises a nucleating agent comprising solid particles having a polar surface charge.

In any one or combination of the foregoing embodiments, the solid particles comprise a surface treatment that provides a polar surface charge.

In any one or combination of the foregoing embodiments, the additive comprises a nucleating agent having a positive surface charge.

In any one or combination of the foregoing embodiments, the additive comprises a nucleating agent having a negative surface charge.

In any one or combination of the foregoing embodiments, the additive comprises electrocalorically active solid particles.

In any one or combination of the foregoing embodiments, the additive can be uniformly distributed throughout the electrocaloric material. Alternatively, in any one or combination of the foregoing embodiments, the electrical can have a compositional variation in the electrocaloric material can comprise a compositional variation in the concentration or composition of the additive throughout the thickness of the material between the electrodes, which variation can be configured as a continuous gradient, discrete layers of different composition, or as discrete filaments of different composition.

In any one or combination of the foregoing embodiments, the system further comprises means for selectively directing transfer of heat energy from the electrocaloric element to the heat sink along the first thermal flow path, or from the heat source to the electrocaloric element along the second thermal flow path.

BRIEF DESCRIPTION OF THE DRAWINGS

Subject matter of this disclosure is particularly pointed out and distinctly claimed in the claims at the conclusion of the specification. The foregoing and other features, and advantages of the present disclosure are apparent from the following detailed description taken in conjunction with the accompanying drawings in which:

The FIGURE is a schematic depiction of an exemplary cooling system as described herein.

DETAILED DESCRIPTION

As mentioned above, the heat transfer system utilizes an electrocaloric material that is a copolymer of a monomer mixture comprising (i) vinylidene fluoride (VF), (ii) an addition polymerization monomer selected from tetrafluoroethylene, trifluoroethylene, or a monomer smaller than trifluoroethylene, and (iii) a halogenated addition polymerization monomer different than (ii) that is larger than vinylidene fluoride. In some embodiments, the monomer (ii) comprises TrFE. In some embodiments, the monomer (ii) comprises tetrafluoroethylene (TFE). In some embodiments, the monomer (ii) comprises a monomer smaller than TrFE, such as vinyl fluoride (VF) or ethylene. In some embodiments, the monomer (ii) comprises a combination of two or more of the above monomers. Examples of the monomer (iii) include but are not limited to chlorofluoroethylene (CFE), chlorotrifluoroethylene (CTFE), hexafluoropropylene (HFP), vinylidene chloride (VDC) 1,1-difluoropropylene (DFP), 2,3,3,3-tetrafluoropropylene (TFP). In some embodiments, the monomer (iii) comprises CFE or a halogenated polymerizable monomer larger than CTFE. In some embodiments, the monomer (iii) comprises CFE. Chlorine substituents in the monomer (iii) or other monomers in the copolymer can be randomly distributed along the copolymer backbone, or they can have an ordered distribution along the backbone as described in patent application PCT/US16/39609, the disclosure of which is incorporated herein by reference in its entirety. Examples of copolymers include, but are not limited to P(VDF-TrFE-CFE), P(VDF-TrFE-CTFE), P(VDF-TrFE-HFP), P(VDF-TrFE-TFE), P(VDF-TrFE-VDC), P(VDF-TFE-CFE), P(VDF-TFE-CTFE), P(VDF-TFE-HFP), P(VDF-TFE-VDC), P(VDF-TrFE-DFP), P(VDF-TrFE-TFP), P(VDF-VF-CFE), P(VDF-VF-TFP), P(VDF-TrFE-TFP), P(VDF-TrFE-VF-CFE), P(VDF-VF-CFE-TFP) and mixtures thereof. The amounts of the respective monomers in the copolymer can vary depending on desired properties of the copolymer. In some example embodiments, the monomer (i) can be present in an amount in a range having a low end of 45 mole %, more specifically 50 mole %, and more specifically 55 mole %, and an upper end of 75 mole %, more specifically 70 mole %, and more specifically 65 mole %. In some example embodiments, the monomer (ii) can be present in an amount in a range having a low end of 20 mole %, more specifically 22 mole %, and more specifically 25 mole %, and an upper end of 38 mole %, more specifically 35 mole %, and more specifically 33 mole %. In some example embodiments, the monomer (iii) can be present in an amount in a range having a low end of 2 mole %, more specifically 4 mole %, and more specifically 6 mole %, and an upper end of 12 mole %, more specifically 10 mole %, and more specifically 8 mole %. The above upper and lower range endpoints can be independently combined to disclose a number of different ranges.

As mentioned above, the electrocaloric material includes an additive selected from a nucleating agent having a polar surface charge, electrocalorically active solid particles, or combinations thereof. Various types of nucleating agents can be used. In some embodiments, the nucleating agent is a molecular compound. Many such molecular nucleating agents are known and are commercially available. In some embodiments, the nucleating agent can be solid particles. In some embodiments, the nucleating agent has a positive surface charge. In some embodiments, the electrocaloric material can include both positive surface charge and negative surface charge nucleating agents, or a nucleating agent having surface portion(s) with positive charge and surface portions with negative charge.

Positive molecular nucleation agents can be made up of ionic liquids, molten salts, or salts which have a crystallization temperature above the crystallization point of PVDF (nominally 140° C.). Some examples of positive nucleating agents include tetrabutylphosphonium hexafluorophosphate, ethyltriphenylphosphonium bromide, n-heptyltriphenylphosphonium bromide, n-acetonylpyridinium bromide, 1-butyl-1-methylpyrrolidinium bromide, or triphenylsulfonium tetrafluoroborate. Negative nucleation agents can be made up of organic salts which have a crystallization temperature above the crystallization point of PVDF (nominally 140° C.). Some examples negative nucleating agents include sodium lauryl sulfate, sodium n-tridecyl sulfate, or 1-naphthyl phosphate monosodium salt monohydrate. Although this disclosure is not dependent on or limited by any particular mechanism or theory, a polar surface charge of the nucleating agent can in some embodiments promote formation of polar β or γ crystalline phases that can contribute to electrocaloric effect. In some embodiments, the nucleating agent has a lower solubility in a casting solvent than does the electrocaloric copolymer, which can promote precipitation of the nucleating agent before the copolymer for nucleation effect. In some embodiments, the nucleating agent has a higher melting point than the electrocaloric copolymer. Molecular nucleating agents can be used in amounts in a range having a low end of 0.001 wt. %, more specifically 0.05 wt. %, and more specifically 0.1 wt. %, and an upper end of 15 wt. %, more specifically 10 wt. %, and more specifically 5 wt. %, with percentages based on the total weight of the solid film.

Solid particles such as clays can also be used as nucleating agents. Examples of nanoparticle nucleating agents include but are not limited to Montmorilonite, kaolinite, halloysite boron nitride, silcon nitride, mica, silica, alumina, talc, titanium dioxide, and polytetrafluoroethyene. Some solid particulate nucleating agents may contain an inherent polar surface charge, and any solid particulate nucleating can also be processed with surface treatments such as silanes, phosphates and other salts, acids, amines, epoxides, or ionic liquids to impart a polar surface charge. Solid particle nucleating agents can have particle size ranges in a range having a low end of 1 nm, more specifically 3 nm, more specifically 5 nm, and an upper end of 1000 nm, more specifically 700 nm, more specifically 500 nm, more specifically 300 nm, and even more specifically 100 nm. Solid particle nucleating agents can be used in amounts in a range having a low end of 0.001 wt. %, more specifically 0.05 wt. %, and more specifically 0.1 wt. %, and an upper end of 15 wt. %, more specifically 10 wt. %, and more specifically 5 wt. %, with percentages based on the total weight of the solid film.

The additive can also include electrocalorically active filler particles. The particles can be sized in the conventional polymer filler size range to promote electrocaloric activity of the electrocaloric material, or can be in the nanoscopic range as described above for nanoparticle nucleating agents, which can promote nucleation in addition promoting electrocaloric activity. Examples of materials for electrocalorically active filler particles include but are not limited to barrium strontium titanate, barium zirconium titanate, lead zirconate, barium titanate, lead manganese niobate-lead titanate mixtures, aluminum nitride, gallium nitride and its alloys, zinc oxide, and lithium niobate or lithium tantalite. Electrocalorically active filler particles can have particle size ranges in a range having a low end of 1 nm, more specifically 3 nm, and more specifically 5 nm, and an upper end that can be as defined above for solid particle nucleating agents (e.g., which particles can perform a dual function of providing electrocaloric effect and providing nucleation for the copolymer), or can extend to higher upper limits of end of 10 µm, more specifically 5 µm, and more specifically 1 µm. Electrocalorically active filler particles can be used in amounts in a range having a low end of 0.001 wt. %, more specifically 0.05 wt. %, and more specifically 0.1 wt. %, and an upper end of 15 wt. %, more specifically 10 wt. %, and more specifically 5 wt. %, with percentages based on the total weight of the solid film.

In some embodiments, the electrocaloric material can be made by dissolving or dispersing the electrocaloric copolymer(s) in an organic solvent to form a liquid composition, casting the liquid composition onto a substrate, evaporating the solvent to form an electrocaloric film, and removing the electrocaloric film from the substrate. In some embodiments, the solvent(s) can have a boiling point of less than 100° C., more specifically less than 80° C., and even more specifically 70° C. In some embodiments, the solvent can have a boiling point of at least 50° C., more specifically 55° C., and even more specifically 60° C. It is understood that these upper and lower range limits can be independently combined to disclose a number of different possible ranges. As used herein, unless otherwise explicitly stated boiling point means boiling point at 1 atmosphere pressure. Although this disclosure is not bound by any particular mechanism or theory, rapid solvent evaporation from low boiling point solvents, low pressure during evaporation, or both, can in some embodiments promote high density, low porosity, and formation of crystalline domains in the polymer matrix that promote beneficial electrocaloric performance.

With respect to the solvent, any organic solvent within the specified boiling point range can be used. In some embodiments, a polar organic solvent is used, and can in some aspects provide compatibility with the polarity of the electrocaloric polymer. In other embodiments, a non-polar organic solvent can be used. Mixtures of polar and non-polar organic solvents can also be used. Examples of solvents include but are not limited to tetrahydrofuran (THF), butanone (i.e., methylethyl ketone or MEK), chlorobenzene, supercritical $CO_2$.

The concentration of the electrocaloric polymer in a solvent coating composition can vary widely, depending on the type of coating technique and the desired dried thickness of the coating. In some embodiments, the electrocaloric polymer content range from a lower endpoint of 0.1 wt. %, more specifically 1 wt. %, to an upper endpoint of 50 wt. %, more specifically 20 wt. %, based on the total weight of the coating composition, it being understood that the above endpoints can be independently combined to yield a number of different ranges.

In some embodiments, forming and solidifying the film can comprise forming a thermoplastic fluid melt comprising the electrocaloric copolymer, forming a film of the thermoplastic fluid melt, and cooling to solidify the film. In some embodiments, the thermoplastic fluid melt can be extruded as a film into a cooling medium, blow-molded using film-forming blow-molding techniques, or coated onto a substrate.

In some embodiments, the additive can be dissolved or dispersed in the fluid copolymer composition. In some embodiments, the fluid copolymer composition can be cast or coated onto a substrate that comprises the additive. In some embodiments, the additive can be dissolved or dispersed in the fluid copolymer composition and the fluid copolymer composition is cast onto a substrate comprising the same or a different additive.

In some embodiments, a method of making a heat transfer system comprises making an electrocaloric element according to any one or combination of the above method embodiments, and further comprising providing a heat flow path between the electrocaloric element and a heat source or a heat sink for controlled heat transfer between the electrocaloric element and the heat source or heat sink.

In some embodiments, the cast fluid composition can be subjected to a constant or a varying electric field during casting, evaporation, annealing, or physical manipulation (e.g., stretching) to impact the alignment of the polymer macromolecules and polar substituents in crystalline domains. After the film is dried and removed from the substrate, it can optionally be subjected to an annealing process by heating. The electrocaloric material can be subjected to various processing other protocols to promote or otherwise impact the electrocaloric effect of the material or other properties. In some embodiments, the solid film can be subjected to stretching or other physical manipulations (before, during, or after annealing), which can impact the alignment of the polymer macromolecules and polar substituents in crystalline domains.

The fluid copolymer composition can include additives and coating aids such as surfactants, lubricants, substrate release agents, stabilizers, antioxidants, and others can be included. Various substrates can be used, including but not limited to glass, polished stainless steel, or solvent-resistant polymers (polytetrafluoroethylene) or polymers that are dissolvable in solvents other than the solvent used for coating the electrocaloric polymer (e.g., polypropylene). Release of the electrocaloric film can be facilitated by functionalization of the substrate using low surface-energy liquids such as polyorganosiloxanes or by dissolving a polymer substrate in a solvent that doesn't dissolve the coated electrocaloric film (e.g., a non-polar organic solvent). In some embodiments, the substrate can include the additive such as a nucleating agent at the interface surface with the copolymer, for example solid particle nucleating agents on the substrate surface or in the substrate at the surface, or pre-treatment of the substrate surface with a solution or dispersion of a molecular nucleating agent.

Any of a variety of coating techniques can be used. Examples of coating techniques include, doctor blade coating, spray coating, roll coating, brush coating, spin coating, and other known coating techniques. In some aspects, doctor blade coating is used with constant speed of 1 mm/second to 1 km/second. After coating, the cast film can be dried (e.g., for 1 to 24 hours) and removed from the substrate. In some embodiments, the organic solvent is evaporated at a temperature of 0° C. to 100° C. In some embodiments, the solvent is evaporated under a pressure of less than or equal to 1 atmosphere, although pressure can in some embodiments be up to 3 atmospheres or even as high as 10 atmospheres. In some embodiments, the cast film on the substrate can be soaked in water or an organic liquid that will not adversely impact the film properties for a period of time (e.g., 1 minute to 100 hours, more specifically 6 minutes to 2 hours) to facilitate separation of the film from the substrate. After removal from the substrate, the film can be subjected to additional drying if needed to remove any liquid that was used to facilitate separation from the substrate. In some embodiments, the film can optionally be subjected to annealing. Annealing can be carried out at temperatures in a range having a lower endpoint of 30° C., more specifically 40° C., and an upper endpoint of 200° C., more specifically 100° C., it being understood that these endpoints can be independently combined to produce a number of different ranges.

An example embodiment of a heat transfer system and its operation are further described with respect to the FIGURE. As shown in the FIGURE, a heat transfer system 10 comprises an electrocaloric element comprising an electrocaloric polymer film 12 having electrodes 14 and 16 on opposite sides thereof. Multiple electrocaloric elements configured in a stack can also be used. The electrocaloric element is in thermal communication with a heat sink 17 through a first thermal flow path 18, and in thermal communication with a heat source 20 through a second thermal flow path 22. The thermal flow paths are described below with respect thermal transfer through flow of a heat transfer fluid through control valves 26 and 28 between the electrocaloric element and the heat sink and heat source, but can also be through conductive heat transfer through solid state heat thermoelectric switches in thermally conductive contact with the electrocaloric element and the heat source or heat sink, or thermomechanical switches in movable to establish thermally conductive contact between the electrocaloric element and the heat source or heat sink. A controller 24 serves as an electrical power source and is configured to control electrical current to through a power source (not shown) to selectively activate the electrodes 14, 16. The controller 24 is also configured to open and close control valves 26 and 28 to selectively direct the heat transfer fluid along the first and second flow paths 18 and 22.

In operation, the system 10 can be operated by the controller 24 applying an electric field as a voltage differential across the electrocaloric element to cause a decrease in entropy and a release of heat energy by the electrocaloric elements. The controller 24 opens the control valve 26 to transfer at least a portion of the released heat energy along flow path 18 to heat sink 17. This transfer of heat can occur after the temperature of the electrocaloric elements has risen to a threshold temperature. In some embodiments, heat transfer to the heat sink 17 is begun as soon as the temperature of the electrocaloric elements increases to be about equal to the temperature of the heat sink 17. After application of the electric field for a time to induce a desired release and transfer of heat energy from the electrocaloric elements to the heat sink 17, the electric field can be removed. Removal of the electric field causes an increase in entropy and a decrease in heat energy of the electrocaloric elements. This decrease in heat energy manifests as a reduction in temperature of the electrocaloric elements to a temperature below that of the heat source 20. The controller 24 closes control valve 26 to terminate flow along flow path 18, and opens control device 28 to transfer heat energy from the heat source 20 to the colder electrocaloric elements in order to regenerate the electrocaloric elements for another cycle.

In some embodiments, for example where a heat transfer system is utilized to maintain a temperature in a conditioned space or thermal target, the electric field can be applied to the electrocaloric elements to increase its temperature until the temperature of the electrocaloric element reaches a first threshold. After the first temperature threshold, the controller 24 opens control valve 26 to transfer heat from the electrocaloric elements to the heat sink 17 until a second temperature threshold is reached. The electric field can continue to be applied during all or a portion of the time period between the first and second temperature thresholds, and is then removed to reduce the temperature of the electrocaloric elements until a third temperature threshold is reached. The controller 24 then closes control valve 26 to terminate heat flow transfer along heat flow path 18, and opens control valve 28 to transfer heat from the heat source 20 to the electrocaloric elements. The above steps can be optionally repeated until a target temperature of the conditioned space or thermal target (which can be either the heat source or the heat sink) is reached.

The systems described herein can be operated in a cooling mode where the heat source is a conditioned space or cooling target. The systems described herein can also be operated in a heat pump mode where the heat sink is a conditioned space or heating target. It should also be noted that the described systems are exemplary in nature and that modifications can of course be made. For example, a single controller 24 is shown in the FIGURE, but control could be provided by distributed control or smart components such as temperature-sensitive heat transfer control devices. Also, although the systems are depicted with a single electrocaloric material and electrode assembly, it is understood by the skilled person that connected banks or arrays of elements can be used as well.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A heat transfer system, comprising an electrocaloric material comprising:
   (1) a copolymer of a monomer mixture comprising:
      (i) vinylidene fluoride,
      (ii) an addition polymerization monomer selected from tetrafluoroethylene, or a monomer smaller than trifluoroethylene, and
      (iii) a halogenated addition polymerization monomer different than (ii) that is larger than vinylidene fluoride, and
   (2) an additive comprising a nucleating agent having a polar surface charge;
   electrodes disposed on opposite surfaces of the electrocaloric material; a first thermal flow path between the electrocaloric material and a heat sink; a second thermal flow path between the electrocaloric material and a heat source; and an electric power source configured to provide voltage to the electrodes; wherein the nucleating agent includes positive nucleating agents or negative nucleating agents; wherein positive nucleating agents include tetrabutylphosphonium hexafluorophosphate, ethyltriphenylphosphonium bromide, n-heptyltriphenylphosphonium bromide, n-acetonylpyridinium bromide, 1-butyl-1-methylpyrrolidinium bromide, or triphenylsulfonium tetrafluoroborate; and wherein negative nucleating agents include sodium lauryl sulfate, sodium n-tridecyl sulfate, or 1-naphthyl phosphate monosodium salt monohydrate.

2. The heat transfer system of claim 1, wherein the halogenated addition polymerization monomer (iii) comprises chlorofluoroethylene or a halogenated addition polymerization monomer larger than chlorofluoroethylene.

3. The heat transfer system of claim 2, wherein the halogenated addition polymerization monomer (iii) comprises chlorofluoroethylene.

4. The heat transfer system of claim 1, wherein the additive comprises a molecular nucleating agent.

5. The heat transfer system of claim 1, wherein the additive comprises a nucleating agent comprising solid particles having a polar surface charge.

6. The heat transfer system of claim 5, wherein the solid particles comprise a surface treatment that provides a polar surface charge.

7. The heat transfer system of claim 1, wherein the additive comprises a nucleating agent having a positive surface charge.

8. The heat transfer system of claim 1, wherein the additive comprises a nucleating agent having a negative surface charge.

9. The heat transfer system of claim 1, further comprising means for selectively directing transfer of heat energy from the electrocaloric material to the heat sink along the first thermal flow path, or from the heat source to the electrocaloric material along the second thermal flow path.

10. The heat transfer system of claim 1, wherein the electrocaloric material comprises a compositional variation in the concentration or the composition of the additive throughout the thickness of the material between the electrodes, which variation is configured as a continuous gradient, discrete layers of different composition, or as discrete filaments of different composition.

11. A method of making an electrocaloric element, comprising
   forming and solidifying a film of a fluid composition comprising an electrocaloric copolymer and an additive comprising a nucleating agent having a polar surface charge, the electrocaloric copolymer formed from monomers comprising
   (i) vinylidene fluoride,
   (ii) an addition polymerization monomer selected from tetrafluoroethylene, or a monomer smaller than trifluoroethylene, and
   (iii) a halogenated addition polymerization monomer different than (ii) that is
   larger than vinylidene fluoride, and disposing the film between electrodes; and wherein the nucleating agent includes positive nucleating agents or negative nucleating agents; wherein positive nucleating agents include tetrabutylphosphonium hexafluorophosphate, ethyltriphenylphosphonium bromide, n-heptyltriphenylphosphonium bromide, n-acetonylpyridinium bromide, 1-butyl-1-methylpyrrolidinium bromide, or triphenylsulfonium tetrafluoroborate; and wherein negative nucleating agents include sodium lauryl sulfate, sodium n-tridecyl sulfate, or 1-naphthyl phosphate monosodium salt monohydrate.

12. The method of claim 11, wherein the halogenated addition polymerization monomer (iii) comprises chlorofluoroethylene or a halogenated addition polymerization monomer larger than chlorofluoroethylene.

13. The method of claim 11, wherein the halogenated addition polymerization monomer (iii) comprises chlorofluoroethylene.

14. The method of claim 11, wherein forming and solidifying the film comprises dissolving or dispersing the copolymer in a liquid composition comprising an organic solvent, casting a film of the liquid composition on a substrate, evaporating the solvent to solidify the film, and removing the film from the substrate.

15. The method of claim 11, wherein the additive is dissolved or dispersed in a liquid composition, or a substrate surface comprises the additive, or the additive is dissolved or dispersed in the liquid composition and the substrate surface comprises a nucleating agent.

16. The method of claim 11, wherein forming and solidifying the film comprises forming a thermoplastic fluid melt comprising the copolymer, forming a film of the thermoplastic fluid melt, and cooling to solidify the film.

17. The method of claim 16, wherein the additive is dissolved or dispersed in the thermoplastic fluid melt, or the thermoplastic fluid melt is cast onto a substrate comprising the additive, or the additive is dissolved or dispersed in the thermoplastic fluid melt and the thermoplastic fluid melt is cast onto a substrate comprising the additive.

18. A method of manufacturing a heat transfer system comprising:
   manufacturing an electrocaloric element according to the method of claim 11; and
   providing a heat flow path between the electrocaloric element and a heat source or a heat sink for controlled heat transfer between the electrocaloric element and the heat source or heat sink.

* * * * *